(12) United States Patent
Nishiyama et al.

(10) Patent No.: US 8,203,306 B2
(45) Date of Patent: Jun. 19, 2012

(54) BATTERY PACK AND CONTROL METHOD THEREFOR

(75) Inventors: Shoichi Nishiyama, Fukushima (JP); Masaru Hiratsuka, Kanagawa (JP); Hiroyuki Suzuki, Chiba (JP); Takehiko Tanaka, Fukushima (JP)

(73) Assignee: Sony Corporation, Tokyo (JP)

( * ) Notice: Subject to any disclaimer, the term of this patent is extended or adjusted under 35 U.S.C. 154(b) by 445 days.

(21) Appl. No.: 12/485,120

(22) Filed: Jun. 16, 2009

(65) Prior Publication Data
US 2009/0315520 A1 Dec. 24, 2009

(30) Foreign Application Priority Data
Jun. 24, 2008 (JP) ................................. 2008-164282

(51) Int. Cl.
*H02J 7/00* (2006.01)
(52) U.S. Cl. ......... 320/112; 320/132; 320/134; 320/136
(58) Field of Classification Search .................. 320/112, 320/132, 134, 136; 324/426–434
See application file for complete search history.

(56) References Cited

U.S. PATENT DOCUMENTS

| | | | | |
|---|---|---|---|---|
| 5,432,452 A | * | 7/1995 | Fiorina et al. | ................. 324/427 |
| 5,449,996 A | * | 9/1995 | Matsumoto et al. | .......... 320/148 |
| 6,255,803 B1 | | 7/2001 | Ishihara et al. | |

FOREIGN PATENT DOCUMENTS

JP 2001-116811 7/2001

* cited by examiner

*Primary Examiner* — Samuel Berhanu
(74) *Attorney, Agent, or Firm* — K&L Gates LLP

(57) ABSTRACT

A battery pack includes one or more cell blocks in which one or more secondary battery cells are connected in series and/or in parallel, and a control section for measuring a voltage of the one or more cell blocks to detect an abnormality of a cell block on the basis of a measurement result. The control section calculates a time differential of the voltage for the one or more cell blocks on the basis of the measured voltage, extracts a first time differential which is maximum and a second time differential which is minimum from the time differentials of the voltage for the one or more cell blocks, and determines that a cell block corresponding to the second time differential is abnormal in a case where a difference between the first time differential and the second time differential is less than a prescribed value.

6 Claims, 10 Drawing Sheets

BATTERY PACK AND CONTROL METHOD THEREFOR

CROSS REFERENCES TO RELATED APPLICATIONS

The present application claims priority to Japanese Priority Patent Application JP 2008-164282 filed in the Japan Patent Office on Jun. 24, 2008, the entire content of which is hereby incorporated by reference.

BACKGROUND

The present application relates to a battery pack and a control method for a battery pack for detecting internal short-circuiting of battery cells.

In recent years, portable electronic devices such as notebook personal computers (PCs), cellular phones and personal digital assistants (PDAs) have been in widespread use, and lithium-ion secondary batteries have been widely used as power sources for the devices because of their advantages such as high voltage, high energy density and lightweightness.

Battery cells of lithium-ion secondary batteries may deteriorate or heat up abnormally if the lithium-ion secondary batteries are overcharged to a voltage above a predetermined voltage when they are charged or overdischarged to a voltage below a predetermined voltage when they are discharged. Therefore, a battery pack containing a lithium-ion secondary battery is generally equipped with a protection circuit for protecting the battery from being overcharged and overdischarged.

In general, such a protection circuit measures the charge and discharge currents of the secondary battery and the voltage of each block of the battery cells to detect an abnormality such as overcharging, overdischarging or abnormal cell balance on the basis of the measurement results. When it is determined from the detection results that the battery cells are abnormal, the protection circuit performs a protection operation such as prohibiting charging and discharging of the secondary battery.

In addition, when a battery pack containing a secondary battery is subjected to abnormal charging and discharging repeatedly, or to an external stress which deforms the cells inside, or when foreign matter enters the battery cells, an abnormality due to short-circuiting may occur in the battery cells. When an abnormality due to internal short-circuiting occurs, the protection operation based on the detection process and detection results discussed above may not be sufficient, and the short-circuiting inside the battery cells may lead to a serious accident such as fire produced from the battery pack.

In order to address the foregoing issue, various schemes have recently been proposed to detect an abnormality of battery cells due to internal short-circuiting. For example, Japanese Patent No. 3437823 discloses a method in which the voltages of cell blocks are measured, and an abnormality due to short-circuiting in battery cells is detected according to whether or not the difference between the maximum voltage and the minimum voltage continues to be a predetermined threshold or more for a prescribed time.

SUMMARY

However, the characteristics of a battery pack change in accordance with changes in environmental temperature and the degree of deterioration of battery cells. Therefore, heat or fire may be produced by internal short-circuiting before the voltage difference is equal to or more than the threshold for the prescribed time, even if the prescribed time is determined in consideration of changes in environmental temperature and the degree of deterioration of battery cells.

Thus, it is desirable to provide a battery pack and a control method for a battery pack for detecting an abnormality of battery cells due to internal short-circuiting without being affected by changes in environmental temperature and the like.

According to a first embodiment, there is provided a battery pack including: one or a plurality of cell blocks in which one or a plurality of secondary battery cells are connected in series and/or in parallel; and a control section for measuring a voltage of the one or the plurality of cell blocks to detect an abnormality of a cell block on the basis of a measurement result. The control section calculates a time differential of the voltage for the one or the plurality of cell blocks on the basis of the measured voltage, extracts a first time differential which is maximum and a second time differential which is minimum from the time differentials of the voltage for the one or the plurality of cell blocks, and determines that a cell block corresponding to the second time differential is abnormal in a case where a difference between the first time differential and the second time differential is less than a prescribed value.

According to a second embodiment, there is provided a battery pack including: one or a plurality of cell blocks in which one or a plurality of secondary battery cells are connected in series and/or in parallel; and a control section for measuring a voltage and a charge current of the one or the plurality of cell blocks to detect an abnormality of a cell block on the basis of a measurement result. The control section calculates time differentials of the voltage and the charge current and second-order time differentials of the voltage and the charge current for the one or the plurality of cell blocks on the basis of the measured voltage and charge current determines that a cell block is abnormal in a case where the time differential of the voltage is less than a prescribed value, the second-order time differential of the voltage is less than the prescribed value, and the second-order time differential of the charge current is not less than the prescribed value, and determines that a cell block is abnormal in a case where the time differential of the charge current is more than the prescribed value, the second-order time differential of the charge current is more than the prescribed value, and the second-order time differential of the voltage is not more than the prescribed value.

According to a third embodiment, there is provided a battery pack including: one or a plurality of cell blocks in which one or a plurality of secondary battery cells are connected in series and/or in parallel; and a control section for measuring a voltage and a charge current of the one or the plurality of cell blocks to detect an abnormality of a cell block on the basis of a measurement result. The control section calculates a time differential of the voltage and second-order time differentials of the voltage and the charge current for the one or the plurality of cell blocks on the basis of the measured voltage and charge current extracts a first time differential which is maximum and a second time differential which is minimum from the time differentials of the voltage for the one or the plurality of cell blocks, and determines that a cell block corresponding to the second time differential is abnormal in a case where a difference between the first time differential and the second time differential is less than a prescribed value, the second-order time differential of the voltage is less than the prescribed value, and the second-order time differential of the charge current is not less than the prescribed value.

According to a fourth embodiment, there is provided a control method for a battery pack, including the steps of: measuring a voltage of one or a plurality of cell blocks in which one or a plurality of secondary battery cells are connected in series and/or in parallel; calculating a time differential of the voltage for the one or the plurality of cell blocks on the basis of the measured voltage; extracting a first time differential which is maximum and a second time differential which is minimum from the time differentials of the voltage for the one or the plurality of cell blocks; and determining that a cell block corresponding to the second time differential is abnormal in a case where a difference between the first time differential and the second time differential is less than a prescribed value.

According to a fifth embodiment, there is provided a control method for a battery pack, including the steps of: measuring a voltage and a charge current of one or a plurality of cell blocks in which one or a plurality of secondary battery cells are connected in series and/or in parallel; calculating time differentials of the voltage and the charge current and second-order time differentials of the voltage and the charge current for the one or the plurality of cell blocks on the basis of the measured voltage and charge current; determining that a cell block is abnormal in a case where the time differential of the voltage is less than a prescribed value, the second-order time differential of the voltage is less than the prescribed value, and the second-order time differential of the charge current is not less than the prescribed value; and determining that a cell block is abnormal in a case where the time differential of the charge current is more than the prescribed value, the second-order time differential of the charge current is more than the prescribed value, and the second-order time differential of the voltage is not more than the prescribed value.

According to a sixth embodiment, there is provided a control method for a battery pack, including the steps of: measuring a voltage and a charge current of one or a plurality of cell blocks in which one or a plurality of secondary battery cells are connected in series and/or in parallel; calculating a time differential of the voltage and second-order time differentials of the voltage and the charge current for the one or the plurality of cell blocks on the basis of the measured voltage and charge current; extracting a first time differential which is maximum and a second time differential which is minimum from the time differentials of the voltage for the one or the plurality of cell blocks; and determining that a cell block corresponding to the second time differential is abnormal in a case where a difference between the first time differential and the second time differential is less than a prescribed value, the second-order time differential of the voltage is less than the prescribed value, and the second-order time differential of the charge current is not less than the prescribed value.

As discussed above, according to the first and fourth embodiments, a voltage of one or a plurality of cell blocks in which one or a plurality of secondary battery cells are connected in series and/or in parallel is measured; a time differential of the voltage for the one or the plurality of cell blocks is calculated on the basis of the measured voltage; a first differential which is maximum and a second time differential which is minimum are extracted from the time differentials of the voltage for the one or the plurality of cell blocks; and it is determined that a cell block corresponding to the second time differential is abnormal in a case where a difference between the first time differential and the second time differential is less than a prescribed value. Therefore, an abnormality due to internal short-circuiting in the cell block corresponding to the second time differential may be determined.

According to the second and fifth embodiments, a voltage and a charge current of one or a plurality of cell blocks in which one or a plurality of secondary battery cells are connected in series and/or in parallel are measured; time differentials of the voltage and the charge current and second-order time differentials of the voltage and the charge current for the one or the plurality of cell blocks are calculated on the basis of the measured voltage and charge current; it is determined that a cell block is abnormal in a case where the time differential of the voltage is less than a prescribed value, the second-order time differential of the voltage is less than the prescribed value, and the second-order time differential of the charge current is not less than the prescribed value; and it is determined that a cell block is abnormal in a case where the time differential of the charge current is more than the prescribed value, the second-order time differential of the charge current is more than the prescribed value, and the second-order time differential of the voltage is not more than the prescribed value.

According to the third and sixth embodiments, a voltage and a charge current of one or a plurality of cell blocks in which one or a plurality of secondary battery cells are connected in series and/or in parallel are measured; a time differential of the voltage and second-order time differentials of the voltage and the charge current for the one or the plurality of cell blocks are calculated on the basis of the measured voltage and charge current; a first time differential which is maximum and a second time differential which is minimum are extracted from the time differentials of the voltage for the one or the plurality of cell blocks; and it is determined that a cell block corresponding to the second time differential is abnormal in a case where a difference between the first time differential and the second time differential is less than a prescribed value, the second-order time differential of the voltage is less than the prescribed value, and the second-order time differential of the charge current is not less than the prescribed value.

Additional features and advantages of the present invention are described in, and will be apparent from, the following Detailed Description and the figures.

DETAILED DESCRIPTION

The present application will be described below with reference to the drawings according to an embodiment. In an embodiment, the voltage and the charge current of a secondary battery are measured, and the time differentials of the voltage and the charge current are calculated from the measured voltage and charge current. The occurrence of an abnormality due to internal short-circuiting is detected in battery cells of the secondary battery on the basis of the calculated time differentials.

Figure 1:
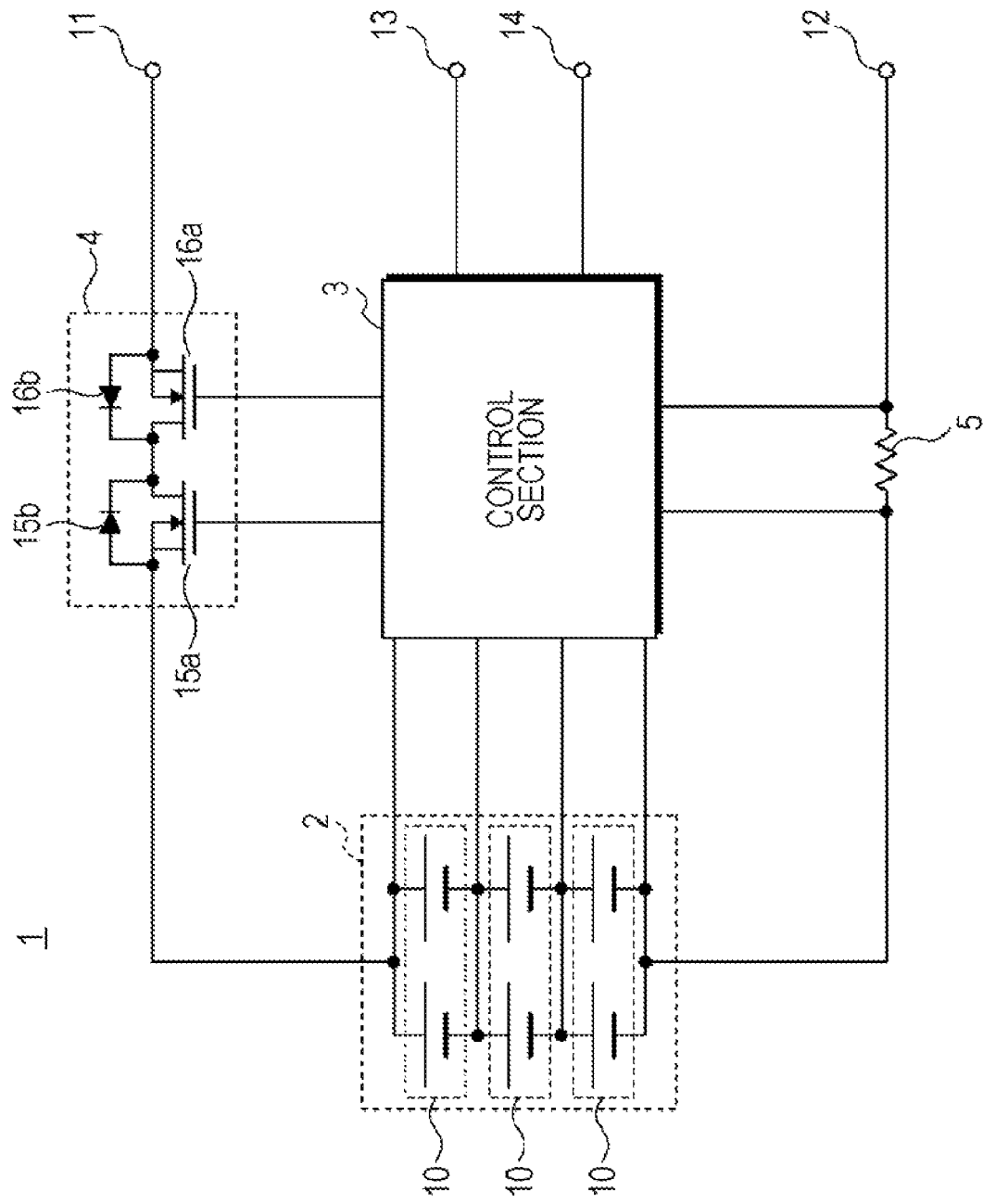
FIG. 1 is a block diagram showing an exemplary configuration of a battery pack applicable to an embodiment.

FIG. 1 shows an exemplary configuration of a battery pack 1 according to an embodiment. When using an external electronic device, a positive terminal 11 and a negative terminal 12 of the battery pack 1 are respectively connected to a positive terminal and a negative terminal of the electronic device for discharging. When charging the battery pack 1, the battery pack 1 is mounted on a charger and, as when using the electronic device, the positive terminal 11 and the negative terminal 12 of the battery pack 1 are respectively connected to a positive terminal and a negative terminal of the charger for charging.

The battery pack 1 mainly includes a secondary battery 2, a control section 3 and a switch circuit 4. In the description of the configuration of the battery pack 1 shown in FIG. 1, only portions significantly relevant to the embodiment are described, and other portions are not described to avoid complexity of description. The secondary battery 2 is a secondary battery such as a lithium-ion secondary battery in which a plurality of battery cells are connected in series and/or in parallel. In this example, battery cells are connected in two parallel lines each including three battery cells connected in series. In the secondary battery 2, cell blocks 10 each including battery cells connected in parallel are connected in series.

The control section 3 measures the voltages of the cell blocks 10 of the secondary battery 2. The control section 3 also measures the magnitude and the direction of the current using a current detection resistance 5. These measurements are performed regularly at predetermined intervals. Then, the control section 3 performs a process for detecting short-circuiting in the battery cells on the basis of the measurement results of the voltages of the cell blocks 10 and the charge and discharge currents of the secondary battery 2. A method for detecting internal short-circuiting will be discussed in detail later.

The control section 3 also prevents overcharging and overdischarging by sending a control signal to the switch circuit 4 when an abnormality is detected on the basis of the measurement results.

When the battery pack 1 is installed in an electronic device such as a personal computer (PC), communication terminals 13 and 14 are used to transmit various information, such as information indicating an abnormality of the battery pack 1, to the electronic device on the basis of a predetermined communication standard. Examples of the communication standard include a system management bus (SMBus) standard mainly used for power source management, for example.

When an abnormality due to short-circuiting in the cell blocks 10 is detected, the control section 3 transmits information indicating the abnormality to the electronic device to which the battery pack 1 is mounted via the communication terminals 13 and 14.

The switch circuit 4 includes a charge control FET 15a and a discharge control FET 16a. When the battery voltage becomes an overcharge detection voltage, the charge control FET 15a is turned off on the basis of a control signal from the control section 3 to perform control so that no charge current flows. After the charge control FET 15a is turned off, only discharging may be performed via a parasitic diode 15b.

When the battery voltage becomes an overdischarge detection voltage, the discharge control FET 16a is turned off on the basis of a control signal from the control section 3 to perform control so that no discharge current flows. After the discharge control FET 16a is turned off, only charge may be performed via a parasitic diode 16b.

Figure 2:
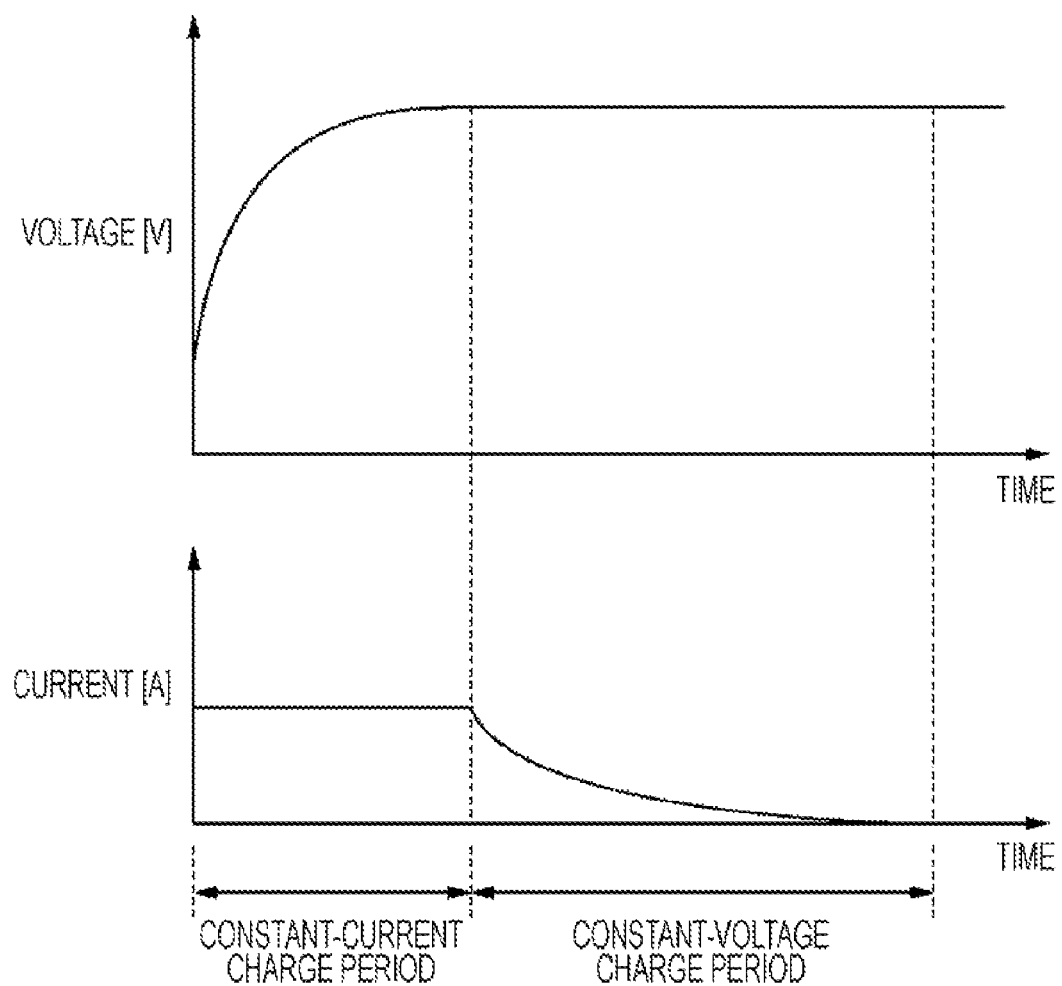
FIG. 2 is a schematic chart showing an example of charge characteristics in a constant-current constant-voltage charging method.

A description is made of a process for detecting an abnormality due to short-circuiting in the battery cells of the battery pack 1. In general, the secondary battery 2 is charged by a constant-current constant-voltage charging (CCCV) method. In the CCCV charging method, as shown in FIG. 2, charging is performed at a constant current until the voltage of the secondary battery 2 reaches a predetermined voltage, after which charging is performed at a constant voltage. Then, charging is finished at the moment when the charge current reaches a prescribed termination current.

In the case where the secondary battery 2 is charged by the CCCV charging method, the secondary battery 2 is charged at a constant charge current in a constant-current charge period which starts immediately after charging starts and ends when the voltage of the secondary battery 2 reaches a predetermined voltage.

In this period, the voltage of a normal cell block 10 with no internal short-circuiting monotonically increases, and at least does not decrease. The voltage of an abnormal cell block 10 with internal short-circuiting decreases at the moment when the internal short-circuiting occurs. Therefore, it may be considered that internal short-circuiting occurs at the moment when the voltage of a cell block 10 decreases.

However, the voltage of a cell block 10 also decreases in the case where the charge current supplied from a charger to the secondary battery 2 is decreased during constant-current charging for some reason, for example. Therefore, it is difficult to determine whether a voltage decrease is caused by internal short-circuiting or variations in charge current.

Accordingly, in an embodiment, the control section 3 calculates time differentials of the voltages of the cell blocks 10 in the constant-current charge period to detect internal short-circuiting on the basis of the difference between the time differentials of the voltages. Hereinafter, the term "time differential of voltage" will be referred to simply as "voltage differential".

Figure 3:
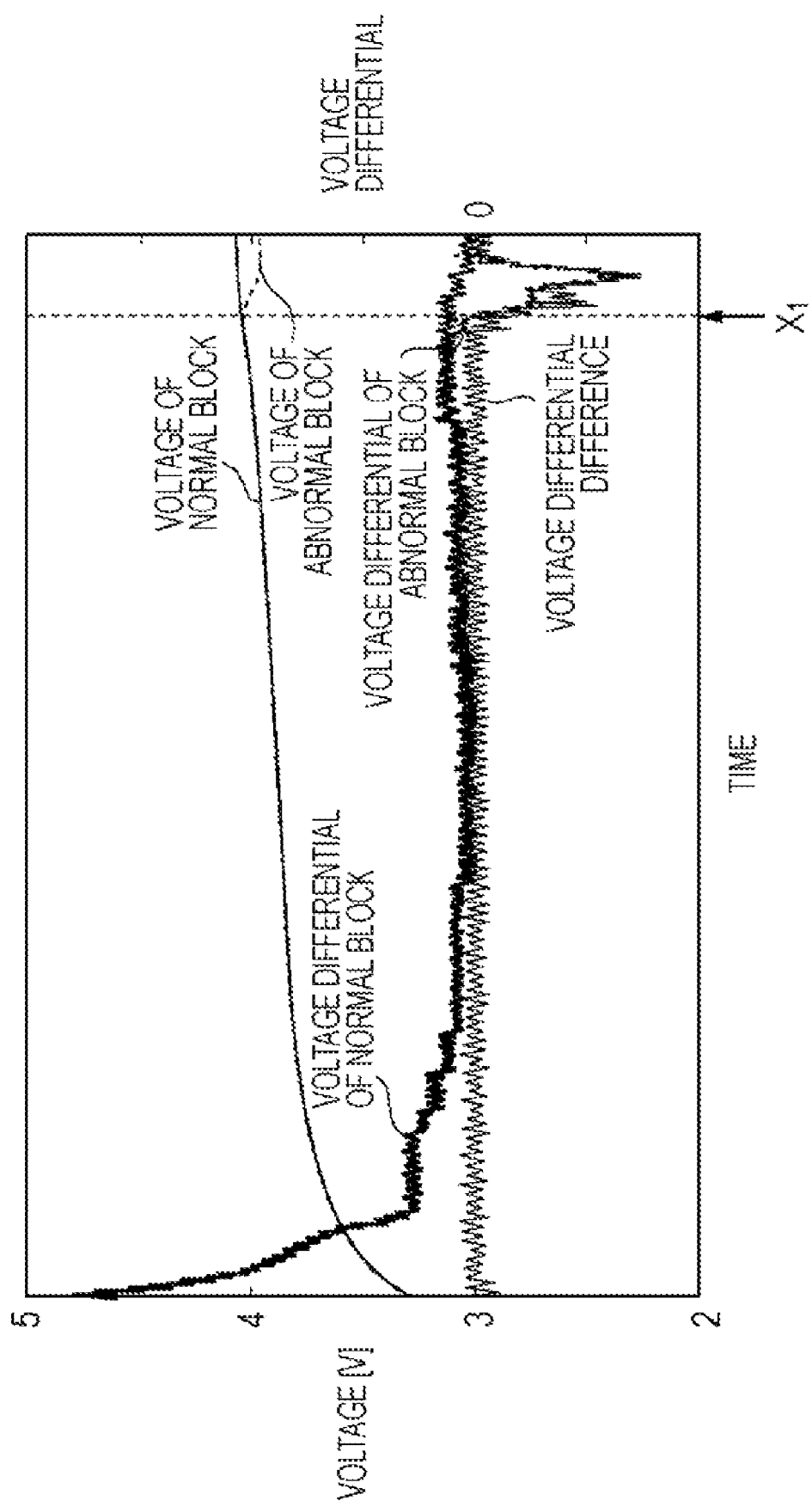
FIG. 3 is a schematic chart showing waveforms for voltages, voltage differentials and a voltage differential difference for cell blocks in a constant-current charge period.

A case is considered where internal short-circuiting occurs in a predetermined cell block 10, of the cell blocks 10 constituting the secondary battery 2, for example. FIG. 3 shows waveforms for the voltages and the voltage differentials of the cell blocks 10 in a constant-current charge period. The horizontal axis represents the time, and the vertical axis represents the voltage and the voltage differential of each cell block 10.

In the constant-current charge period, as shown in FIG. 3, the voltage of a normal cell block (hereinafter occasionally referred to as "normal block") constantly increases or remains constant, and at least does not decrease. Thus, the voltage differential of the normal block is positive or "0" at all times.

Meanwhile, the voltage of an abnormal cell block (hereinafter occasionally referred to as "abnormal block"), in which internal short-circuiting is to occur, is generally the same as the voltage of the normal block, and the voltage differential of the abnormal block is positive or "0", until internal short-circuiting occurs. Then, when internal short-circuiting occurs, the voltage of the abnormal block decreases at a moment $X_1$ when the internal short-circuiting occurs. Thus, the voltage differential of the abnormal block with internal short-circuiting becomes negative at the moment $X_1$ when the internal short-circuiting occurs.

A case is considered where the difference between the voltage differentials for two cell blocks is calculated. If the two cell blocks are normal blocks, the respective voltage differentials of the normal blocks are generally the same positive values or "0". Therefore, the difference between the voltage differentials for the cell blocks 10 is considered to be generally "0".

If one of the two cell blocks is an abnormal block, meanwhile, the voltage differential for the abnormal block becomes negative at the moment when internal short-circuiting occurs. Therefore, the difference between the voltage differentials for the cell blocks 10 is considered to be negative.

Thus, in an embodiment, a maximum differential $dV_{max}/dt$, which is considered to be a differential for a normal block, and a minimum differential $dV_{min}/dt$, which is considered to be a differential for an abnormal block, are extracted from the calculated voltage differentials of the cell blocks 10.

Then, the difference between the maximum differential and the minimum differential, namely a voltage differential difference $dV_{min}/dt - dV_{max}/dt$, is calculated. Then, the calculated voltage differential difference is compared with a prescribed value, which has been set in advance, on the basis of the formula (1).

$$dV_{min}/dt - dV_{max}/dt < \text{prescribed value} \quad (1)$$

If the calculated voltage differential difference is less than the prescribed value, it may be determined that the cell block 10 with the minimum differential $dV_{min}/dt$ is an abnormal block and that internal short-circuiting has occurred.

If all the cell blocks 10 are normal, for example, the voltage differentials of the cell blocks 10 are generally the same and, thus, the voltage differential difference is generally "0" as discussed above. Therefore, although ideally the prescribed value may be set to "0", practically it is preferable to set the prescribed value in consideration of noise level etc. In addition, since the voltage differential difference is generally the same if the cell blocks 10 are normal, a constant value may be selected as the prescribed value which has been set in advance irrespective of changes in environmental temperature, etc.

The voltage differentials of the cell blocks 10 may be calculated to determine whether internal short-circuiting has occurred in a cell block 10 at the moment when the voltage differential of that cell block 10 becomes negative. However, since the voltage differential of a normal cell block 10 is positive and not less than "0" at all times, a greater value may be used to determine whether internal short-circuiting has occurred by calculating the voltage differential difference between a normal cell block and a cell block with internal short-circuiting.

Thus, an abnormality due to internal short-circuiting may be detected more accurately by calculating the voltage differential difference compared to a case where an abnormality is determined only on the basis of the voltage differentials of the cell blocks 10.

Figure 4:
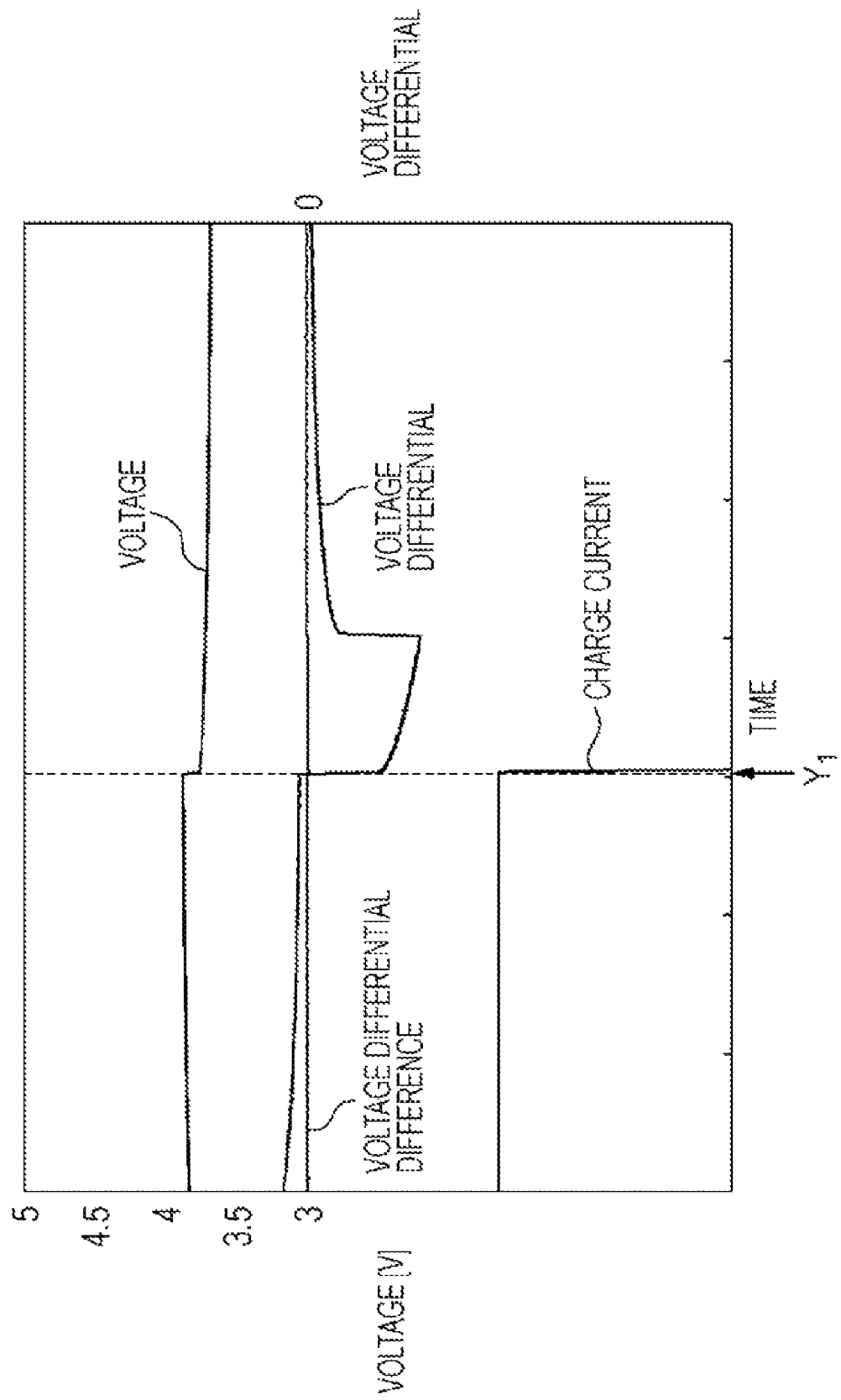
FIG. 4 is a schematic chart showing waveforms for a voltage, a voltage differential and a voltage differential difference in a case where a charge current is changed.

By using the voltage differential difference between the cell blocks 10 as discussed above, in addition, erroneous detection of internal short-circuiting due to variations in charge current may be prevented. A case is considered where the charge current for the secondary battery 2 varies as shown in FIG. 4, for example.

In the secondary battery 2 in which the cell blocks 10 are connected in series, generally the same charge current flows through all the cell blocks 10. When the charge current decreases at a moment $Y_1$, the voltage of the cell blocks 10 decreases irrespective of whether or not the cell blocks 10 are normal.

At this time, the amounts of variations in voltage for the cell blocks 10 are generally the same, and the voltage differentials of the cell blocks 10 are generally the same negative values. That is, the voltage differential difference between the cell blocks 10 calculated using the voltage differentials of the cell blocks is generally "0".

Thus, the voltage differential difference does not become less than the prescribed value in the case where the charge current varies, preventing erroneous detection of an abnormality due to internal short-circuiting caused by variations in charge current.

Figure 5:
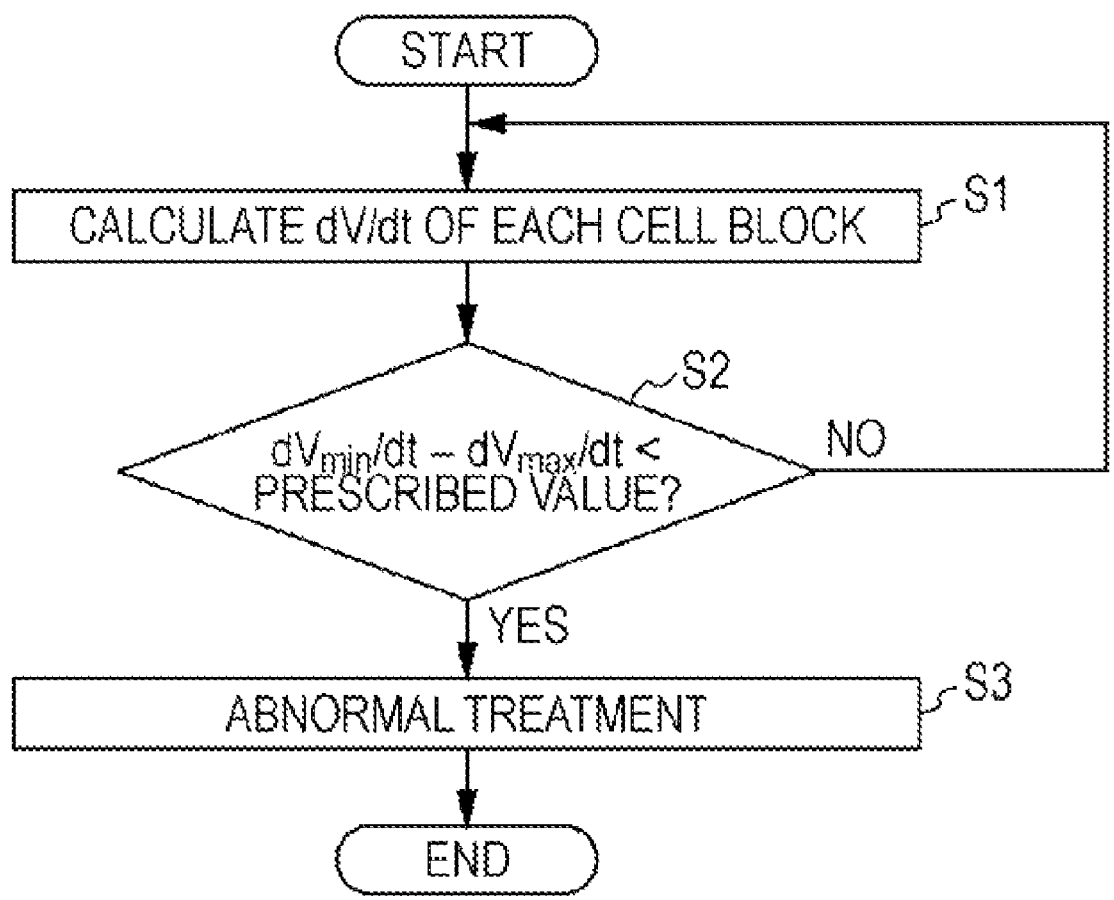
FIG. 5 is a flowchart illustrating a method for detecting an abnormality due to internal short-circuiting applicable to the embodiment.

A description will be made of a method for detecting an abnormality due to internal short-circuiting applicable to the embodiment with reference to the flowchart shown in FIG. 5. The processes described below are performed under control of the control section 3 unless otherwise noted. In step S1, a voltage differential dV/dt for each cell block 10 is calculated on the basis of the measured voltage of each cell block 10.

In step S2, a maximum differential $dV_{max}/dt$ and a minimum differential $dV_{min}/dt$ are selected from the calculated voltage differentials for the cell blocks 10 to calculate a voltage differential difference $dV_{min}/dt - dV_{max}/dt$, which is the difference between the selected differentials. Then, the voltage differential difference $dV_{min}/dt - dV_{max}/dt$ is compared with a prescribed value, which has been set in advance, on the basis of the above formula (1).

If the voltage differential difference is less than the prescribed value, it is determined that an abnormality due to internal short-circuiting has occurred in the cell block 10 with the minimum differential $dV_{min}/dt$, and the process proceeds to step S3. In step S3, an abnormality treatment process is performed so as to control the switch circuit 4 in order to prohibit charging and discharging of the secondary battery 2, or discharge the energy charged in the secondary battery 2, for example. In addition, information indicating the abnormality of the secondary battery 2 is transmitted to an electronic device to which the battery pack 1 is mounted via the communication terminals 13 and 14. The series of processes is thus terminated.

If the voltage differential difference is not less than the prescribed value in step S2, on the other hand, it is determined that the cell blocks 10 are normal. The process returns to step S1, where the voltage differential difference of each cell block 10 is calculated. The processes of steps S1 and S2 are performed cyclically at predetermined intervals.

In an embodiment, as has been described above, an abnormality due to internal short-circuiting may be detected by calculating voltage differentials of the cell blocks 10 and comparing a voltage differential difference calculated on the basis of the voltage differentials with a prescribed value. By detecting an abnormality due to internal short-circuiting on the basis of the voltage differential difference, in addition, erroneous detection of an abnormality due to variations in charge current may be prevented.

Another embodiment of the present application will be described below. As described in relation to the embodiment discussed above, in the case where internal short-circuiting occurs in a cell block 10 in the constant-current charge period, the voltage decreases at the moment when internal short-circuiting has occurred as shown in FIG. 3 even during charging and, thus, the voltage differential dV/dt changes from a positive value into a negative value.

However, also in the case where the charge current decreases for some reason, the voltage decreases likewise as shown in FIG. 4 and, thus, the voltage differential dV/dt becomes negative.

Figure 6:
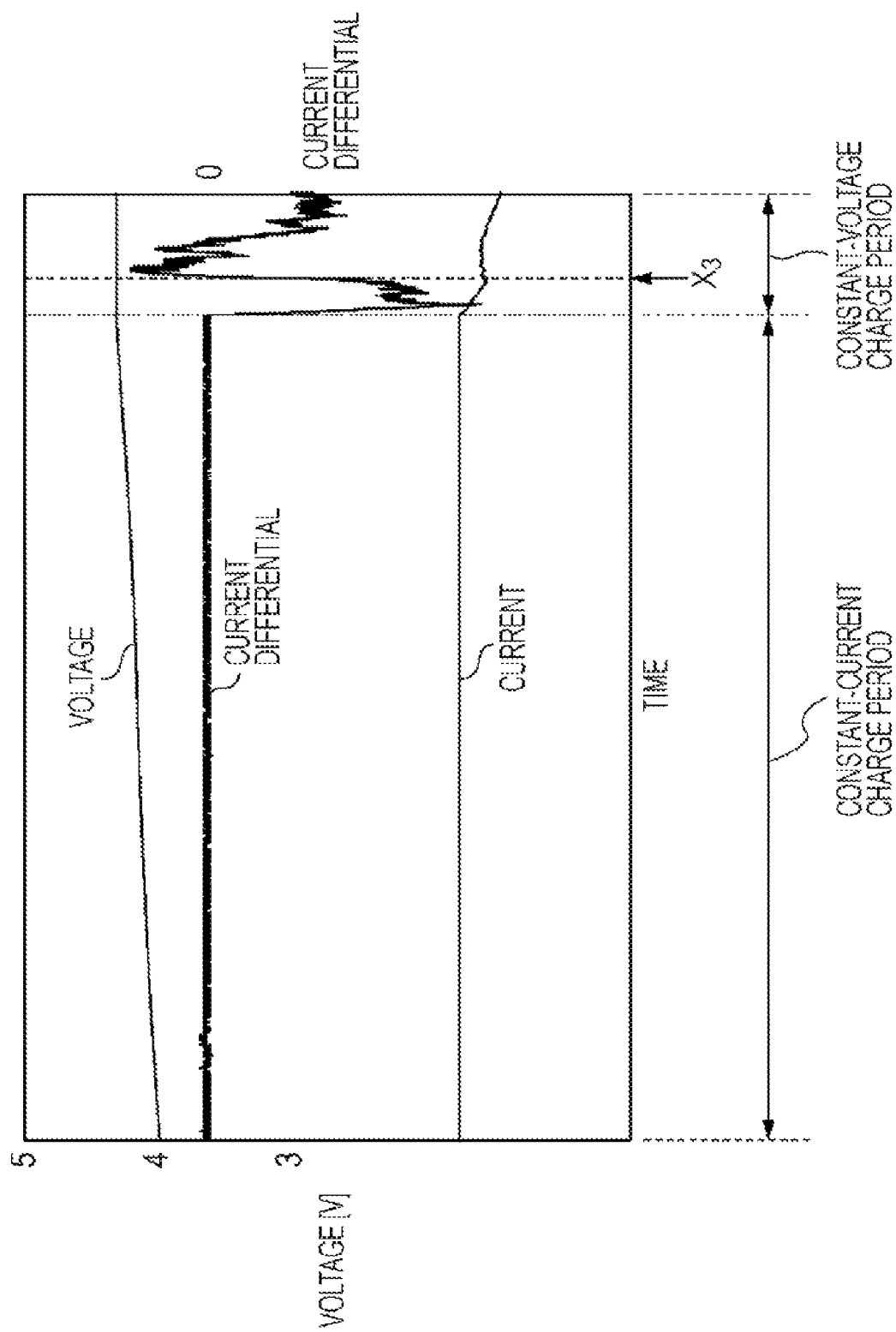
FIG. 6 is a schematic chart showing a waveform for a differential of a charge current for a cell block in a constant-voltage charge period.

Meanwhile, in the constant-voltage charge period, which is entered when the voltage of the secondary battery 2 has reached a predetermined voltage and in which charging is performed at a constant voltage, the charge current gradually decreases as shown in FIG. 2. However, in the case where internal short-circuiting occurs at a moment $X_3$ in the constant-voltage charge period as shown in FIG. 6, for example, the current increases although charging is performed at a constant voltage and the charge current is decreased.

Thus, a charge current differential dI/dt, which is negative in the constant-voltage charge period, becomes positive at the moment $X_3$ when internal short-circuiting has occurred.

Occurrence of internal short-circuiting may be determined at the moment when the charge current differential dI/dt is changed from a negative value into a positive value. However, the charge current differential dI/dt may also be changed from a negative value into a positive value in the case where the charge current increases for some reason.

Therefore, it is difficult to determine whether changes in voltage and charge current differentials are due to internal short-circuiting or due to variations in charge current in the case where voltage and charge current differentials are used.

Accordingly, in an embodiment, second-order voltage differentials and charge current differentials of the cell blocks 10 are used to detect an abnormality due to internal short-circuiting in the cell blocks 10.

Figure 7:
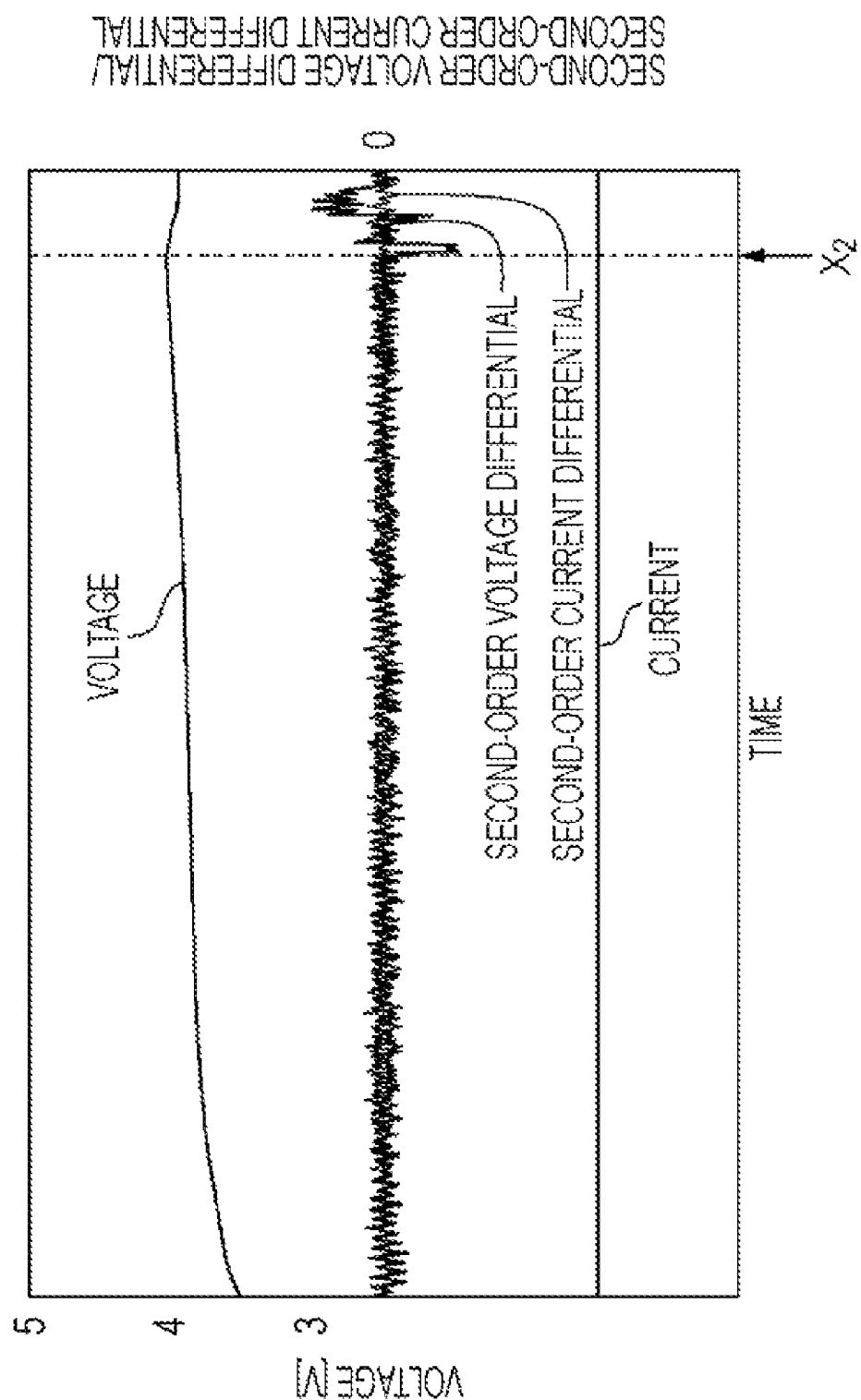
FIG. 7 is a schematic chart showing waveforms for second-order voltage and charge current differentials for a cell block in a constant-current charge period.

First, a description is made of a method for detecting internal short-circuiting in the constant-current charge period. In the case where internal short-circuiting occurs in a predetermined cell block 10 at a moment $X_2$ as shown in FIG. 7, for example, a second-order voltage differential $d^2V/dt^2$ of that cell block 10 becomes less than a prescribed value. Meanwhile, a second-order charge current differential $d^2I/dt^2$ at this time is not less than a prescribed value since charging is performed at a constant current. Although ideally the prescribed value may be set to "0", practically the prescribed value may be set in consideration of noise level etc. as in the above embodiment.

That is, in the case where internal short-circuiting occurs, the second-order voltage and charge current differentials and the prescribed value satisfy the relationship represented by the formula (2):

$$d^2V/dt^2 < \text{prescribed value and } d^2I/dt^2 \geq \text{prescribed value} \qquad (2)$$

Figure 8:
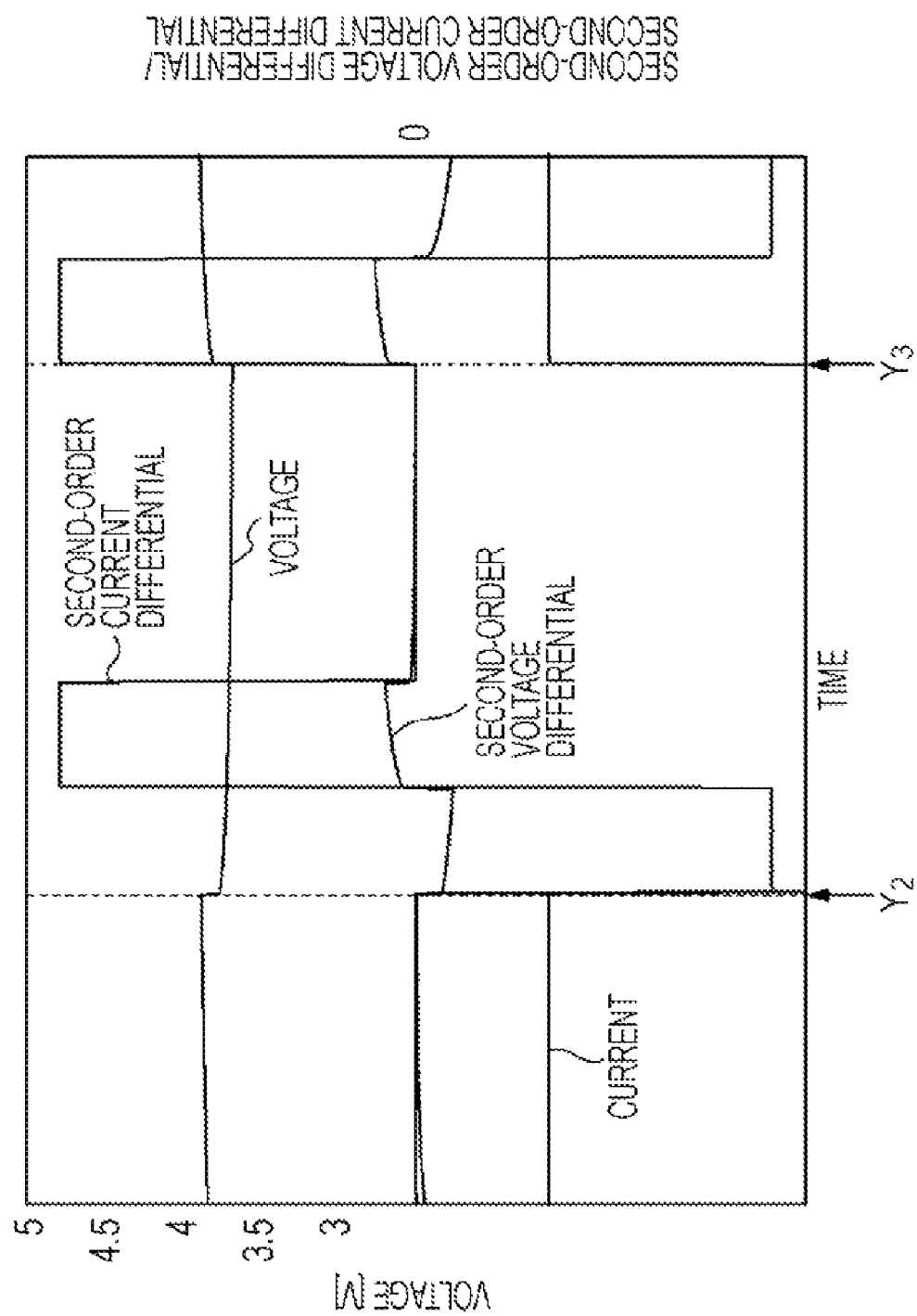
FIG. 8 is a schematic chart showing waveforms for second-order voltage and charge current differentials in a case where a charge current is changed.

On the other hand, in the case where the charge current decreases at a moment $Y_2$ as shown in FIG. 8, the second-order voltage differential $d^2V/dt^2$ of a cell block 10 becomes less than the prescribed value. Meanwhile, the second-order charge current differential $d^2I/dt^2$ at this time is less than the prescribed value since the charge current is lowered.

That is, in the ease where the charge current is lowered, the second-order voltage and charge current differentials and the prescribed value satisfy the relationship represented by the formula (3):

$$d^2V/dt^2 < \text{prescribed value and } d^2I/dt^2 < \text{prescribed value} \qquad (3)$$

Thus, in the constant-current charge period, it may be determined whether or not internal short-circuiting has occurred in a cell block 10 by comparing the second-order voltage and charge current differentials with the prescribed value on the basis of the formula (2). By determining an abnormality due to internal short-circuiting only in the case where the formula (2) is satisfied, erroneous detection of an abnormality due to variations in charge current may be prevented.

Figure 9:
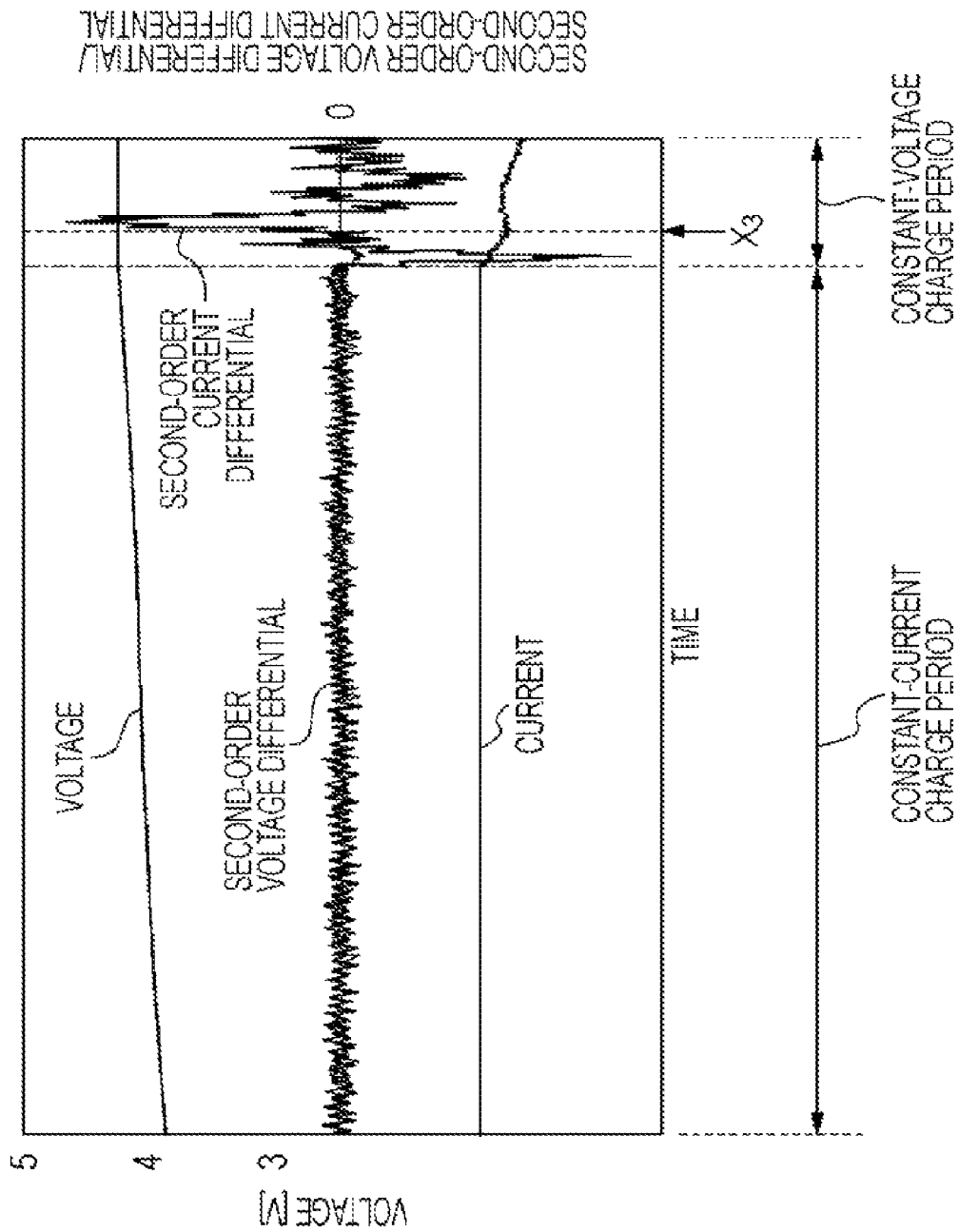
FIG. 9 is a schematic chart showing waveforms for second-order charge current and voltage differentials for a cell block in a constant-voltage charge period.

Now, a description is made of a method for detecting internal short-circuiting in the constant-voltage charge period. In the case where internal short-circuiting occurs in a predetermined cell block 10 at a moment $X_3$ in the constant-voltage charge period as shown in FIG. 9, for example, the second-order charge current differential $d^2I/dt^2$ of that cell block 10 becomes more than the prescribed value. Meanwhile, the second-order voltage differential $d^2V/dt^2$ at this time is not more than a prescribed value since charging is performed at a constant voltage.

That is, in the case where internal short-circuiting occurs, the second-order voltage and charge current differentials and the prescribed value satisfy the relationship represented by the formula (4):

$$d^2I/dt^2 > \text{prescribed value and } d^2V/dt^2 \leq \text{prescribed value} \qquad (4)$$

On the other hand, in the case where the charge current increases at a moment $Y_3$ as shown in FIG. 8, the second-order charge current differential $d^2I/dt^2$ becomes more than the prescribed value. Meanwhile, the second-order voltage differential $d^2V/dt^2$ at this time is more than the prescribed value since the increase in charge current increases the voltage.

That is, in the ease where the charge current is increased, the second-order voltage and charge current differentials and the prescribed value satisfy the relationship represented by the formula (5):

$$d^2I/dt^2 > \text{prescribed value and } d^2V/dt^2 > \text{prescribed value} \qquad (5)$$

Thus, in the constant-voltage charge period, it may be determined whether or not internal short-circuiting has occurred in a cell block 10 by comparing the second-order charge current and voltage differentials with the prescribed value on the basis of the formula (4). By determining an abnormality due to internal short-circuiting only in the case where the formula (4) is satisfied, erroneous detection of an abnormality due to variations in charge current may be prevented.

Figure 10:
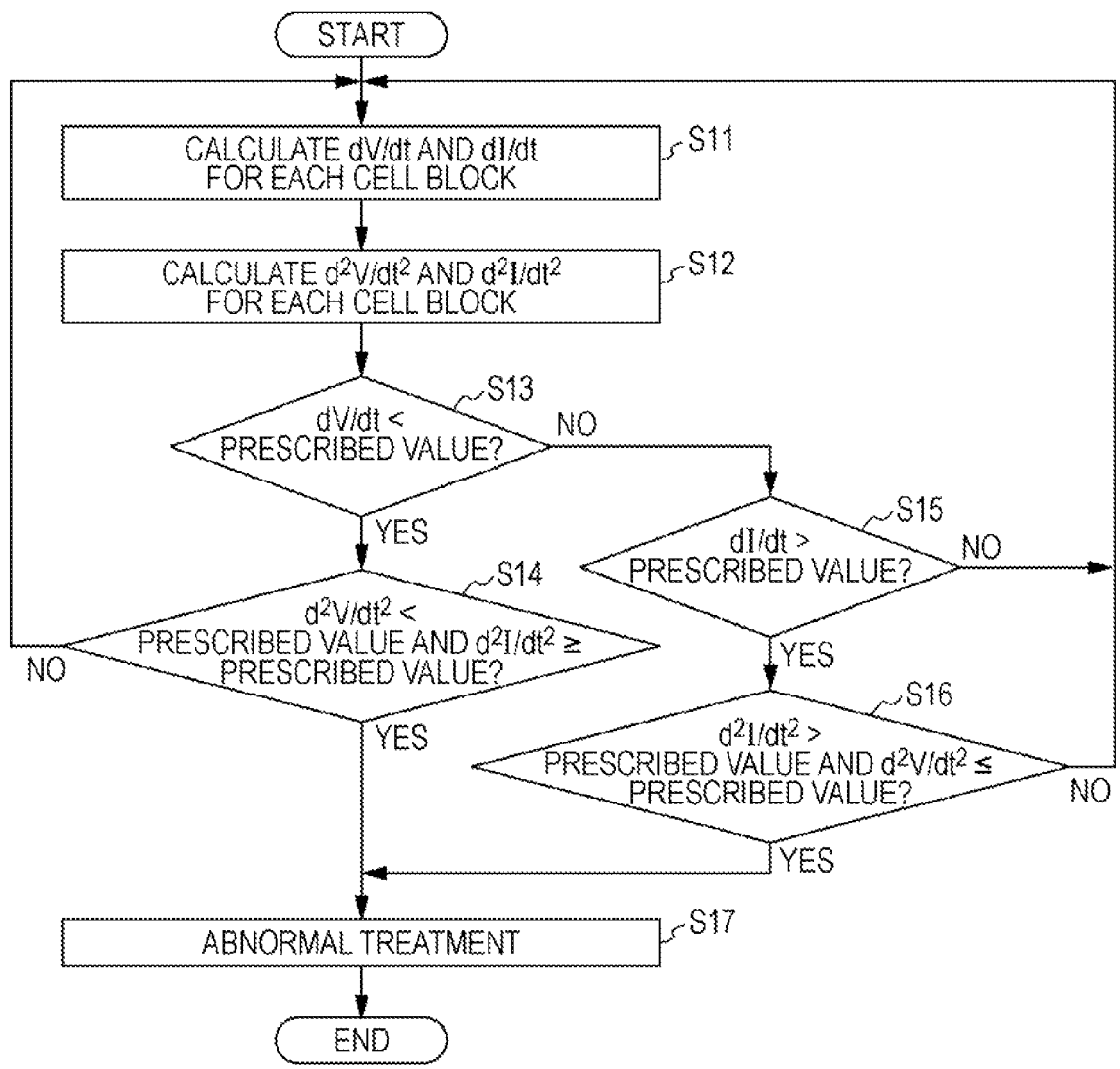
FIG. 10 is a flowchart illustrating a method for detecting an abnormality due to internal short-circuiting applicable to a modified embodiment.

A description will be made of a method for detecting an abnormality due to internal short-circuiting applicable to the modified embodiment with reference to the flowchart shown in FIG. 10. The processes described below are performed under control of the control section 3 unless otherwise noted.

In step S11, a voltage differential dV/dt and a charge current differential dI/dt for each cell block 10 are calculated on the basis of the measured voltage and charge current of each cell block 10. In step S12, a second-order voltage differential $d^2V/dt^2$ and a second-order charge current differential $d^2I/dt^2$ are calculated on the basis of the voltage differential dV/dt and the charge current differential dI/dt calculated in step S11.

In step S13, the voltage differential dV/dt is compared with the prescribed value which has been set in advance. If it is determined that the voltage differential dV/dt is less than the prescribed value, the process proceeds to step S14.

In step S14, the second-order voltage differential dV/dt and the second-order charge current differential $d^2I/dt^2$ are each compared with the prescribed value on the basis of the formula (2). If the formula (2) is satisfied, that is, if the second-order voltage differential $d^2V/dt^2$ is less than the prescribed value and the second-order charge current differential $d^2I/dt^2$ is not less than the prescribed value, it is determined that an abnormality due to internal short-circuiting has occurred, and the process proceeds to step S17.

In the case where the formula (2) is not satisfied, on the other hand, it is determined that the cell blocks 10 are normal, and the process returns to step S11.

Meanwhile, if it is determined that the voltage differential $dV/dt$ is not less than the prescribed value, the process proceeds to step S15. In step S15, the charge current differential $dI/dt$ is compared with the prescribed value which has been set in advance. If it is determined that the charge current differential $dI/dt$ is more than the prescribed value, the process proceeds to step S16.

Meanwhile, if it is determined that the charge current differential $dI/dt$ is not more than the prescribed value, the process returns to step S11.

In step S16, the second-order charge current differential $d^2I/dt^2$ and the second-order voltage differential $d^2V/dt^2$ are each compared with the prescribed value on the basis of the formula (4). If the formula (4) is satisfied, that is, if the second-order charge current differential $d^2I/dt^2$ is more than the prescribed value and the second-order voltage differential $d^2V/dt^2$ is not more than the prescribed value, it is determined that an abnormality due to internal short-circuiting has occurred, and the process proceeds to step S17.

In the case where the formula (4) is not satisfied, on the other hand, it is determined that the cell blocks 10 are normal, and the process returns to step S11.

In step S17, an abnormality treatment process is performed such as controlling the switch circuit 4 so as to prohibit charging and discharging the secondary battery 2, or discharging energy charged to the secondary battery 2, for example. In addition, information indicating the abnormality of the secondary battery 2 is transmitted to an electronic device to which the battery pack 1 is mounted via the communication terminals 13 and 14. The series of processes is thus terminated.

In the modified embodiment, as has been described above, an abnormality due to internal short-circuiting may be detected by calculating a second-order voltage differential and a second-order charge current differential of each cell block 10 and comparing the second-order voltage differential and the second-order charge current differential with the prescribed value. By detecting an abnormality due to internal short-circuiting on the basis of the second-order voltage differentials and the second-order charge current differentials, moreover, erroneous detection of an abnormality due to variations in charge current may be prevented.

The comparison of the second-order voltage differentials and the second-order charge current differentials with the prescribed value described in relation to the modified embodiment may additionally be performed after the comparison of the voltage differential difference with the prescribed value described above in relation to the embodiment.

Specifically, the voltage differential difference, or the difference between the maximum differential $dV_{max}/dt$ and the minimum differential $dV_{min}/dt$ extracted from voltage differentials calculated on the basis of the voltage of each cell block 10, is compared with the prescribed value on the basis of the above formula (1). The second-order voltage differential $d^2V/dt^2$ and the second-order charge current differential $d^2I/dt^2$, which have been calculated on the basis of the voltage and the charge current of a cell block 10, are compared with the prescribed value on the basis of the above formula (2).

Then, it is determined that an abnormality due to internal short-circuiting has occurred in the cell block 10 with the minimum differential if the voltage differential difference is less than the prescribed value based on the formula (1), and the second-order voltage differential is less than the prescribed value and the second-order charge current differential is not less than the prescribed value based on the formula (2).

In this way, an abnormality due to short-circuiting in the cell blocks 10 may be detected more accurately.

Although the present application has been described by way of an embodiment and a modified embodiment thereof the present application is not limited to the embodiments. For example, the secondary battery is not limited to a lithium-ion secondary battery, and other secondary batteries such as a nickel-metal hydride battery and a nickel-cadmium battery may also be used.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A battery pack comprising:
   one or a plurality of cell blocks in which one or a plurality of secondary battery cells are connected at least are of in series and in parallel; and
   a control section for measuring a voltage and a charge current of the one or the plurality of cell blocks to detect an abnormality of a cell block on the basis of a measurement result,
   wherein the control section
   calculates time differentials of the voltage and the charge current and second-order time differentials of the voltage and the charge current for the one or the plurality of cell blocks on the basis of the measured voltage and charge current;
   determines that a cell block is abnormal in a case where the time differential of the voltage is less than a prescribed value, the second-order time differential of the voltage is less than the prescribed value, and the second-order time differential of the charge current is not less than the prescribed value; and
   determines that a cell block is abnormal in a case where the time differential of the charge current is more than the prescribed value, the second-order time differential of the charge current is more than the prescribed value, and the second-order time differential of the voltage is not more than the prescribed value.

2. The battery pack according to claim 1, further comprising:
   a charge/discharge switch for controlling a charge/discharge current for the cell blocks on the basis of control performed by the control section,
   wherein the control section turns off the charge/discharge switch in a case where an abnormality of a cell block is detected.

3. The battery pack according to claim 1, further comprising:
   a communication terminal for communication with an external electronic device,
   wherein the control section transmits information indicating that an abnormality has been detected to the external electronic device via the communication terminal in a case where an abnormality of a cell block is detected.

4. A battery pack comprising:

one or a plurality of cell blocks in which one or a plurality of secondary battery cells are connected at least one of in series and in parallel; and a control section for measuring a voltage and a charge current of the one or the plurality of cell blocks to detect an abnormality of a cell block on the basis of a measurement result, wherein the control section calculates a time differential of the voltage and second-order time differentials of the voltage and the charge current for the one or the plurality of cell blocks on the basis of the measured voltage and charge current;

extracts a first time differential which is maximum and a second time differential which is minimum from the time differentials of the voltage for the one or the plurality of cell blocks; and determines that a cell block corresponding to the second time differential is abnormal in a case where a difference between the first time differential and the second time differential is less than a prescribed value, the second-order time differential of the voltage is less than the prescribed value, and the second-order time differential of the charge current is not less than the prescribed value.

5. A control method for a battery pack, comprising:

measuring a voltage and a charge current of one or a plurality of cell blocks in which one or a plurality of secondary battery cells are connected in series and/or in parallel;

calculating time differentials of the voltage and the charge current and second-order time differentials of the voltage and the charge current for the one or the plurality of cell blocks on the basis of the measured voltage and charge current;

determining that a cell block is abnormal in a case where the time differential of the voltage is less than a prescribed value, the second-order time differential of the voltage is less than the prescribed value, and the second-order time differential of the charge current is not less than the prescribed value; and determining that a cell block is abnormal in a case where the time differential of the charge current is more than the prescribed value, the second-order time differential of the charge current is more than the prescribed value, and the second-order time differential of the voltage is not more than the prescribed value.

6. A control method for a battery pack, comprising:

measuring a voltage and a charge current of one or a plurality of cell blocks in which one or a plurality of secondary battery cells are connected in series and/or in parallel;

calculating a time differential of the voltage and second-order time differentials of the voltage and the charge current for the one or the plurality of cell blocks on the basis of the measured voltage and charge current;

extracting a first time differential which is maximum and a second time differential which is minimum from the time differentials of the voltage for the one or the plurality of cell blocks; and determining that a cell block corresponding to the second time differential is abnormal in a case where a difference between the first time differential and the second time differential is less than a prescribed value, the second-order time differential of the voltage is less than the prescribed value, and the second-order time differential of the charge current is not less than the prescribed value.

\* \* \* \* \*